US007078950B2

(12) United States Patent
Johnson

(10) Patent No.: US 7,078,950 B2
(45) Date of Patent: Jul. 18, 2006

(54) DELAY-LOCKED LOOP WITH FEEDBACK COMPENSATION

(75) Inventor: Gary M Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/895,649

(22) Filed: Jul. 20, 2004

(65) Prior Publication Data

US 2006/0017478 A1 Jan. 26, 2006

(51) Int. Cl.
*H03L 7/06* (2006.01)
(52) U.S. Cl. .................................. 327/158; 327/149
(58) Field of Classification Search ................ 327/149, 327/153, 158, 161, 163; 375/375, 376, 373; 331/17, 25, 18, DIG. 2
See application file for complete search history.

(56) References Cited

U.S. PATENT DOCUMENTS

| | | | | |
|---|---|---|---|---|
| 4,922,141 A | 5/1990 | Lofgren et al. | ............. | 307/595 |
| 5,118,975 A | 6/1992 | Hillis et al. | ................... | 307/602 |
| 5,295,164 A | 3/1994 | Yamamura | ................... | 375/120 |
| 5,336,940 A | 8/1994 | Sorrells et al. | ............ | 307/261 |
| 5,684,421 A | 11/1997 | Chapman et al. | ........... | 327/261 |
| 5,703,489 A | 12/1997 | Kuroe | ......................... | 324/601 |
| 6,003,118 A | 12/1999 | Chen | .......................... | 711/167 |
| 6,016,282 A | 1/2000 | Keeth | .......................... | 365/233 |
| 6,101,197 A | 8/2000 | Keeth et al. | ................. | 365/233 |
| 6,300,807 B1 | 10/2001 | Miyazaki et al. | ........... | 327/158 |
| 6,323,705 B1 | 11/2001 | Shieh et al. | ................. | 327/158 |
| 6,327,318 B1 | 12/2001 | Bhullar et al. | .............. | 375/374 |
| 6,373,913 B1 | 4/2002 | Lee | .............................. | 375/376 |
| 6,381,194 B1 | 4/2002 | Li | ................................ | 365/233 |
| 6,404,250 B1 | 6/2002 | Volrath et al. | .............. | 327/160 |
| 6,437,613 B1 | 8/2002 | Shim et al. | .................. | 327/141 |
| 6,445,231 B1 | 9/2002 | Baker et al. | ................. | 327/158 |
| 6,446,180 B1 | 9/2002 | Li et al. | ...................... | 711/167 |
| 6,472,921 B1 | 10/2002 | Rao et al. | .................... | 327/237 |
| 6,476,652 B1 | 11/2002 | Lee et al. | .................... | 327/158 |
| 6,480,047 B1 | 11/2002 | Abdel-Maguid et al. | .... | 327/161 |
| 6,483,359 B1 | 11/2002 | Lee | ............................ | 327/158 |
| 6,489,823 B1 | 12/2002 | Iwamoto | ..................... | 327/158 |
| 6,531,926 B1 | 3/2003 | Pate et al. | ..................... | 331/17 |
| 6,538,956 B1 | 3/2003 | Ryu et al. | .................... | 365/233 |
| 6,552,587 B1 | 4/2003 | Kim et al. | ................... | 327/158 |
| 6,556,489 B1 * | 4/2003 | Gomm et al. | ................ | 365/194 |
| 6,584,021 B1 | 6/2003 | Heyne et al. | ................ | 365/194 |
| 6,628,154 B1 | 9/2003 | Fiscus | ......................... | 327/158 |
| 6,812,760 B1 | 11/2004 | Kim et al. | ................... | 327/158 |
| 6,839,301 B1 | 1/2005 | Lin et al. | ..................... | 365/233 |
| 6,895,522 B1 | 5/2005 | Johnson et al. | ............. | 713/401 |
| 2003/0012320 A1 | 1/2003 | Bell | ............................ | 375/376 |

* cited by examiner

*Primary Examiner*—Linh My Nguyen
(74) *Attorney, Agent, or Firm*—Fish & Neave IP Group Ropes & Gray LLP

(57) ABSTRACT

A delay-locked loop (DLL) with feedback compensation is provided to increase the speed and accuracy of the DLL. After the variable delay line of the DLL is adjusted to minimize phase error, multiple clock cycles may be required before the adjusted signal is fed back to the phase detector. During this time, a signal replicating the adjusted signal is temporarily fed to the phase detector until the adjusted signal reaches the phase detector.

24 Claims, 5 Drawing Sheets

DELAY-LOCKED LOOP WITH FEEDBACK COMPENSATION

BACKGROUND OF THE INVENTION

This invention relates to delay-locked loop (DLL) circuits. More particularly, this invention relates to DLLs with feedback compensation.

A DLL uses a variable delay line to add phase delay to an input reference clock signal before that clock signal is output from the DLL. The DLL uses a phase detector to measure the phase difference between the output of the DLL and the reference clock and to adjust the variable delay to obtain the desired phase difference, which is usually zero.

As clock speeds increase, the relative length of the delay through a DLL (in clock cycles) also increases. The shorter clock period of a high speed clock becomes a smaller fraction of the total delay through a DLL. After the variable delay of the DLL is adjusted to minimize phase errors (i.e., the difference between the desired and measured phases), multiple clock periods are often required for the adjustments to propagate completely through the DLL. During this time, incorrect phase information is collected and may be acted upon by the phase detector. This can adversely affect the accuracy and performance of the DLL.

In view of the forgoing, it would be desirable to provide feedback compensation in a DLL circuit such that the circuit does not process incorrect phase information and more quickly processes updated phase information.

SUMMARY OF THE INVENTION

It is an object of this invention to provide a delay-locked loop (DLL) circuit that does not process incorrect phase information and that more quickly processes current phase information. While phase adjusted clock signals are still propagating through the circuit, feedback compensation adds or subtracts delay from the feedback path of the DLL to allow updated phase information to be input to the phase detector without having to wait for the adjusted clock signal to propagate through the entire DLL. Feedback compensation thus preferably provides faster and more accurate phase measurements in the DLL.

In accordance with the invention, a DLL is provided with feedback compensation to vary the delay of the feedback path in coordination with adjustments made to the variable delay of the DLL.

One or more delay models are provided in the feedback path of the DLL. When the phase detector detects a phase difference between the input and output clock signals of the DLL, it adjusts the variable delay of the DLL to minimize phase errors. At the same time, the delay model or models are applied to the inputs of the phase detector. After the adjusted signal is propagated through the DLL, the delay model or models are removed from the inputs of the phase detector. This allows the adjustment to the clock signal to be input to the phase detector quickly rather than waiting for the adjusted clock signal to propagate through the adjusted variable delay to the phase detector. This advantageously allows the DLL to correct the phase error between the input and output signals more quickly and accurately.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention provides feedback compensation in delay-locked loop (DLL) circuitry to improve the performance and accuracy of the DLL. This is accomplished by preventing the DLL from acting on old, out of date, phase information.

Figure 1:
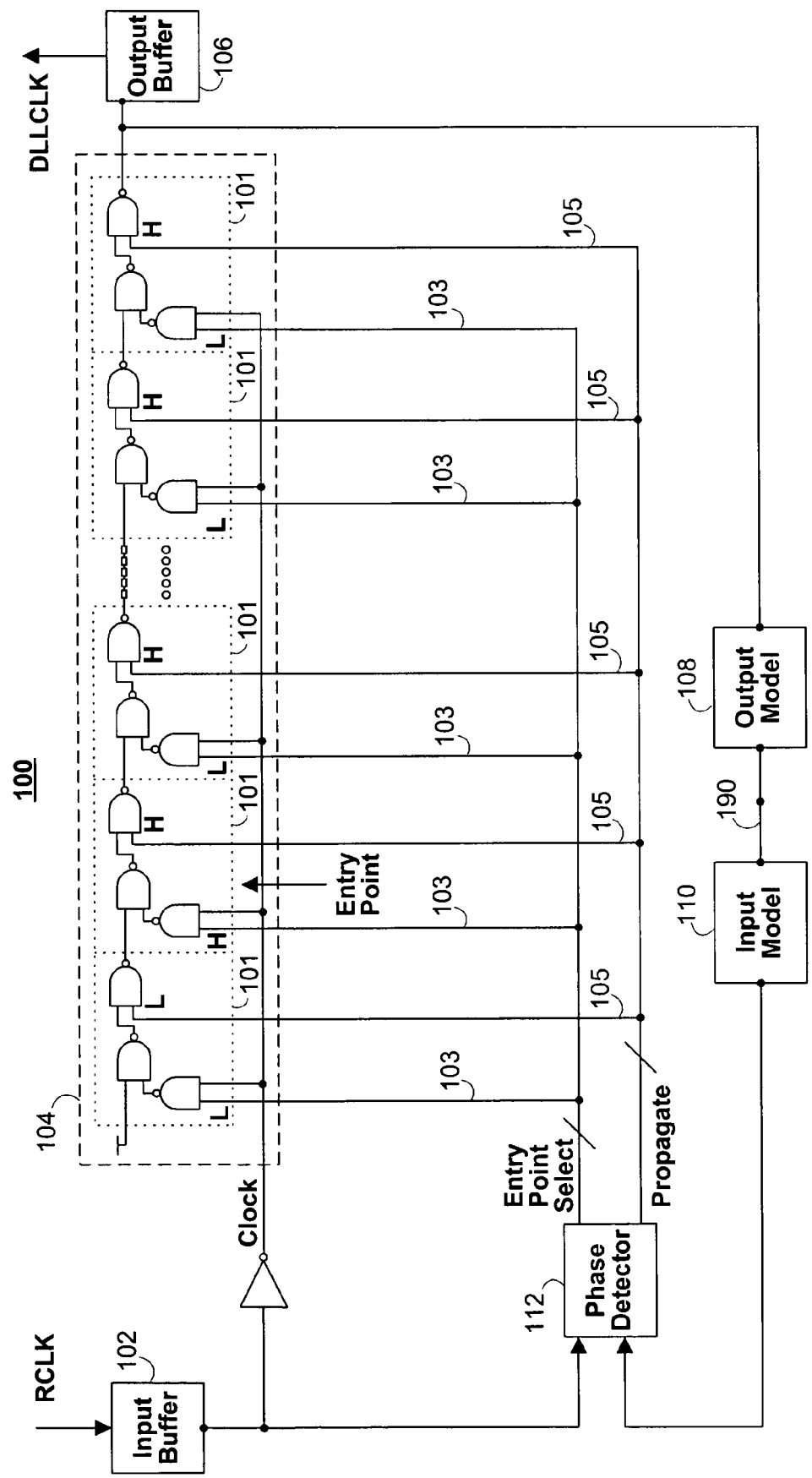
FIG. 1 is a block diagram of a typical delay-locked loop (DLL)

FIG. 1 shows typical DLL circuit 100. Reference clock signal RCLK is input into DLL 100 and signal DLLCLK, a delayed and synchronized version of RCLK, is output. The phase difference between RCLK and DLLCLK is ideally zero in many cases.

DLL 100 typically includes input buffer 102, variable delay line 104, output buffer 106, output delay model 108, input delay model 110, and phase detector 112. (Delay models 108 and 110 are often shown as a single delay circuit, but are shown here as two circuits for better understanding of their purpose.) Reference clock signal RCLK enters DLL 100 and passes through input buffer 102, variable delay 104, and output buffer 106 before being output as clock signal DLLCLK. Variable delay line 104 is ideally set to provide and maintain a phase specified relationship between DLL output signal DLLCLK and DLL input signal RCLK. For example, in order for DLLCLK to be in phase with RCLK, the total delay of input buffer 102, variable delay 104, and output buffer 106, should be a multiple of the clock period $t_{ck}$ (i.e., the delay is set to be equal to $N*t_{ck}$, where N is a whole number greater than or equal to 1).

The output of variable delay 104 is fed back through output delay model 108 and input delay model 110 to phase detector 112. Delay model 108 is configured to have approximately the same delay as output buffer 106. Delay model 110 is configured to have approximately the same delay as input buffer 102. Delay models 108 and 110 may also be configured to approximate other delays and any other delays that may be present at the input or output of DLL 100. (Alternatively, delay models 110 and 108 can be implemented as a single delay model circuit having a total delay equal to the sum of delays through 108 and 110.) Delay models 108 and 110 are inserted in the feedback path that node 190 is ideally in phase with signal DLLCLK.

Phase detector 112 compares the phase difference between the input clock signal RCLK and the feedback signal. Phase detector 112 may then adjust the delay of variable delay line 104 based on the measured phase difference. Variable delay line 104 is adjusted to minimize any phase error between RCLK and DLLCLK. After variable delay 104 has been adjusted to its optimal setting, the DLL circuit is said to be locked.

Variable delay 104 is made up of a series of individual delay units 101. The number of delay units 101 that the input clock signal is propagated through affects the total delay provided by variable delay line 104. In DLL 100, the delay of variable delay line 104 is adjusted by varying the entry point of the delay line (i.e., the particular delay unit 101 through which the clock signal enters the delay line). The earlier (i.e., the more to the left as shown in FIG. 1) the clock signal enters variable delay line 104, the more delay units the clock signal propagates through before reaching the output, and thus the longer the delay.

In an alternative embodiment, the delay line may be adjusted by varying a delay unit exit point while keeping the delay unit entry point fixed. The clock signal enters the delay line at the same point and the amount of delay is varied by changing the point at which the signal exits the delay line. However, an entry-point variable delay line is usually preferred, because it is easier to control the timing of the adjustments to the entry-point variable delay such that discontinuities are prevented at the variable delay output. For example, an improperly timed adjustment to the delay unit exit point can cause an erroneous transition in the output signal. In contrast, adjusting the delay unit entry point will not affect the incoming reference clock signal.

As shown in FIG. 1, for example, the second delay unit 101 from the left is set as the entry point. The input clock signal RCLK enters variable delay line 104 through this delay unit 101 and propagates through to the output of variable delay line 104. The delay may be increased by shifting the entry point left by one delay unit 101 or may be decreased by shifting the entry point to the right by one or more delay units 104.

In this embodiment, each delay unit 101 has two control inputs connected to phase detector 112: entry point input 103 and propagate input 105. When entry point input 103 is set HIGH, the input clock signal is able to pass into delay unit 101. Ordinarily, only one delay unit 101 will have entry point input 103 set HIGH. This delay unit 101 is then the entry point for variable delay line 104. The rest of the entry point inputs 103 should be set LOW. Propagate input 105 may be set to permit or prevent a clock signal from propagating from one delay unit 101 to the next delay unit 101. Ordinarily, all delay units 101 to the right of and including the entry point delay unit 101 will have propagate inputs 105 set HIGH. All delay units to the left of entry point delay unit 101 will have propagate inputs 105 set LOW. These settings permit the clock signal applied to the entry point delay unit 101 to propagate through delay line 104, but prevent stray signals from entering or propagating through variable delay line 104 from delay units upstream from the entry point delay unit 101. All propagate inputs 105 may be set LOW during a system reset to quickly stop any signal from propagating through variable delay line 104. When variable delay line 104 is adjusted, entry point inputs 103 and propagate inputs 105 are adjusted accordingly.

As clock speeds of circuits increase (i.e., as clock periods become shorter), the number of clock periods required to propagate a signal through DLL 100 also increases. The shorter clock period becomes a smaller fraction of the total delay through the DLL. Thus, when phase detector 112 detects a phase difference and adjusts variable delay line 104, it may take many clock periods for the modified delay to propagate through variable delay line 104 and delay models 108 and 110 before being detected at phase detector 112.

For example, if the minimum total delay of DLL 100 is five clock periods long, each adjustment of variable delay line 104 takes at least five clock periods before the adjusted clock signal arrives at phase detector 112. Thus, the phase detector will detect the same phase error for at least four additional clock periods after the adjustment is made.

In known DLLs such as DLL 100, this incorrect information may be acted upon to make additional (unnecessary) adjustments to variable delay line 104. Because phase detector 112 detects the phase difference at each and every clock cycle and adjusts variable delay line 104 based on this information, this incorrect information may result in adjusting variable delay line 104 multiple times for the same phase error, causing the DLL to consistently overshoot its desired lock point.

In other known systems, the phase difference is averaged over multiple clock cycles and the variable delay line is only adjusted periodically. In these systems, the old phase information still adversely affects the accuracy of the phase detector's measurements and may cause occasional misshifts.

In some other known systems, there may be a required number of clock periods between phase adjustments. Feedback signal phase information is ignored between these clock periods. This gives the adjusted signal enough time to propagate to phase detector 104. However, these DLLs are slow to minimize phase errors when multiple phase adjustments are necessary.

Figure 2:
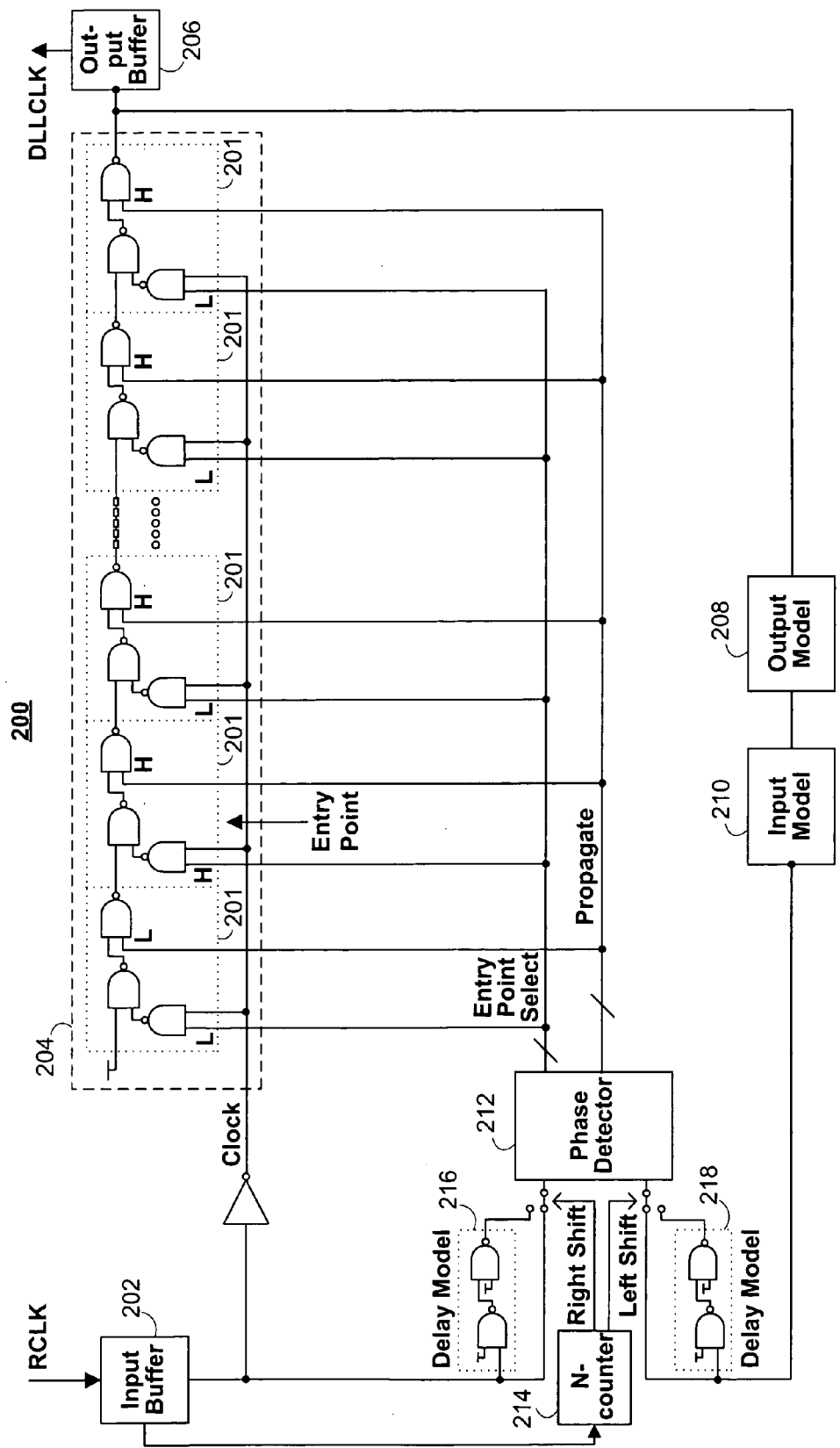
FIG. 2 is a block diagram of a DLL with feedback compensation according to the invention.

FIG. 2 shows DLL 200 with feedback compensation in accordance with the invention. As with DLL 100, DLL 200 includes input buffer 202, variable delay line 204, output buffer 206, output delay model 208, input delay model 210, and phase detector 212, which all operate similarly or identically to their corresponding counterparts in DLL 100. DLL 200 also preferably includes N-counter 214, right-shift delay model 216, and left-shift delay model 218.

The outputs of left-shift delay model 216 and right-shift delay model 218 are connected to the inputs of phase detector 212. Each of the delay models has a delay ideally equal to the delay of one delay unit 201 of variable delay line 204. For example, when phase detector 212 causes a right shift in variable delay line 204 to shorten the delay, it normally takes multiple clock periods for this shortened delay to reach the input of phase detector 212. In DLL 200 however, right-shift delay model 216 advantageously delays the input clock RCLK by one unit delay, which has the same affect as right-shifting variable delay line 204 by one unit delay. The output of right-shift delay model 216 continues to be fed to phase detector 212 until N-counter 214 counts enough clock cycles for the affect of the shortened delay to reach phase detector 212. N-counter 214 then disables the output of right-shift delay model 216, allowing RCLK to be input directly to phase detector 212. Left-shift delay model 218 operates similarly when variable delay line 204 is adjusted (left shift) to increase the delay. Thus, by applying the output of right-shift delay 216 or left-shift delay 218 to replicate the affect of a right or left shift by variable delay line 204, correctly adjusted "facsimile" signals are immediately available at the inputs to phase detector 212. This allows phase detector 212 to more accurately and quickly detect and compensate for phase differences between the input and output clock signals of DLL 200.

Note that in this embodiment, only one left or right shift may be made within the time it takes for the delayed clock signal to propagate through the circuit. One shift may be immediately replicated by delay models 216 or 218, but not two or more. However, in other embodiments of the invention, additional delay models can be added or right- and left-shift delay models can be provided that allow multiple selectable levels of delay to be added to the inputs of the phase detector. These embodiments advantageously allow the phase detector to accurately detect phase differences and adjust delay line 204 multiple times before the actual adjusted clock signals are propagated through the delay line.

Note that in another embodiment, left-shift delay model 216 and right-shift delay model 218 can be replaced with a single delay model connected to a single input of phase detector 212. For example, this single delay model may have two serially connected delay units. Ordinarily only one of the delay units would be connected in the feedback path. Adjustments to the variable delay line 204 can be replicated in the feedback path by increasing the delay of the feedback path to two delay units or decreasing the delay to zero delay units. The default presence of the single delay unit in the feedback path may be compensated for by, for example, adjusting output delay model 208 and input delay model 210.

Returning to DLL 200, the length of the delay and thus the number of clock cycles N in which the adjusted clock signal propagates through variable delay line 204 is usually known. After a shift of variable delay line 204, the appropriate delay model 216 or 218 is enabled to add delay to the appropriate signal path for N−1 clock cycles, which is the time necessary for the adjusted signal to reach phase detector 212.

In some DLLs according to the invention, the value of N is fixed by the design and specification of the DLL. In some other DLLs according to the invention, the value of N is not known or is variable. For example, if a DLL is designed to handle a range of input clock signal frequencies, the value of N will vary with the frequency of the input. The higher the clock frequency, the higher the value of N. In this case, the value of N may be determined by the DLL, and N-counter 214 may be adjusted based on that determination.

The value of N can be determined by a number of standard techniques. For example, the value of N can be determined by measuring the input clock frequency and calculating a value for N based on the design specifications or performance of the DLL. Or N can be determined by inputting a single or unique pulse into the DLL and measuring the amount of time or the number of clock periods it takes for the pulse to propagate through the DLL. N can also be determined by adjusting variable delay line 204 and measuring the amount of time or number of clock periods that pass until the output signal is affected.

In another embodiment, N-counter 214 is configured to handle a range of possible values for N. N-counter 214 enables the appropriate delay model, and phase detector 212 is active for a period of time corresponding to the minimum value of N. Then, until the end of the period of time corresponding to the maximum value of N, delay model and phase detector 212 are disabled to prevent the detection of potentially inaccurate phase information. For example, if N can have a value that ranges anywhere between five and eight clock periods, the appropriate delay model is enabled and the phase information is detected for five clock periods. The phase information is then ignored by phase detector 212 for the remaining three clock periods. This embodiment provides a balance between allowing the phase detector to quickly detect and correct phase errors and avoiding possibly inaccurate phase information that can adversely affect circuit performance.

Figure 3:
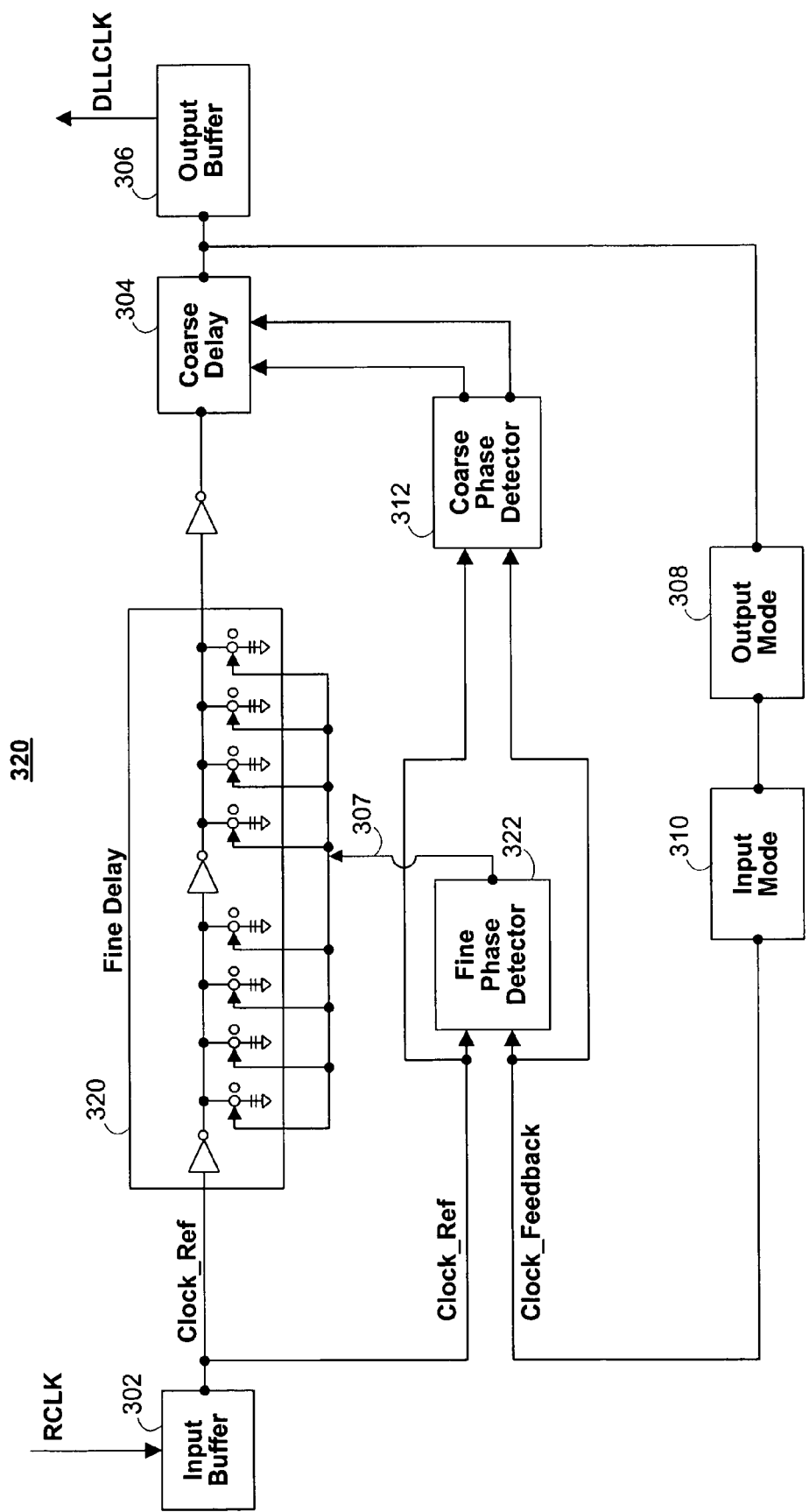
FIG. 3 is a block diagram of a typical DLL with fine and coarse delay adjustments.

FIG. 3 shows typical DLL 300 with coarse and fine delay adjustments. Like DLL 100, DLL 300 includes input buffer 302, variable delay line 304, output buffer 306, output delay model 308, input delay model 310, and phase detector 312, which all operate similarly or identically to their corresponding counterparts in DLL 100. DLL 300 also preferably includes fine delay line 320 and fine phase detector 322.

DLL 300 includes fine delay line 320 in addition to variable delay line 304 to more precisely adjust the phase delay of the synchronized clock signal. Fine delay line 320 may adjust the delay of synchronized clock signal in units less than one unit delay of variable delay line 304. After variable delay line 304 is set to its optimal value, fine delay line 320 may be adjusted to further reduce any phase difference between the input reference clock signal and the DLL output signal.

Fine delay line 320 is controlled by fine phase detector 322. The functionality of fine phase detector 322 may alternatively be incorporated within phase detector 312. Fine phase detector 322 adjusts fine delay line 320 using control line 307. The delay of fine delay line 320 is adjusted typically by connecting and disconnecting capacitors 303 with switches 305. The delay of fine delay line 320 is increased by switching more capacitors 303 into fine delay line 320 and decreased by disconnecting capacitors 303 from fine delay line 320.

After DLL 300 is locked, any phase error that develops between DLL input and output may be corrected by adjusting fine delay line 320. If the phase correction exceeds the range of fine delay line 320, variable delay line 304 is adjusted and then fine delay line 320 may be adjusted. Having variable delay line 304 for course delay adjustment and fine delay line 320 for fine delay adjustment allows DLL 300 to achieve a more precise synchronized output signal.

Figure 4:
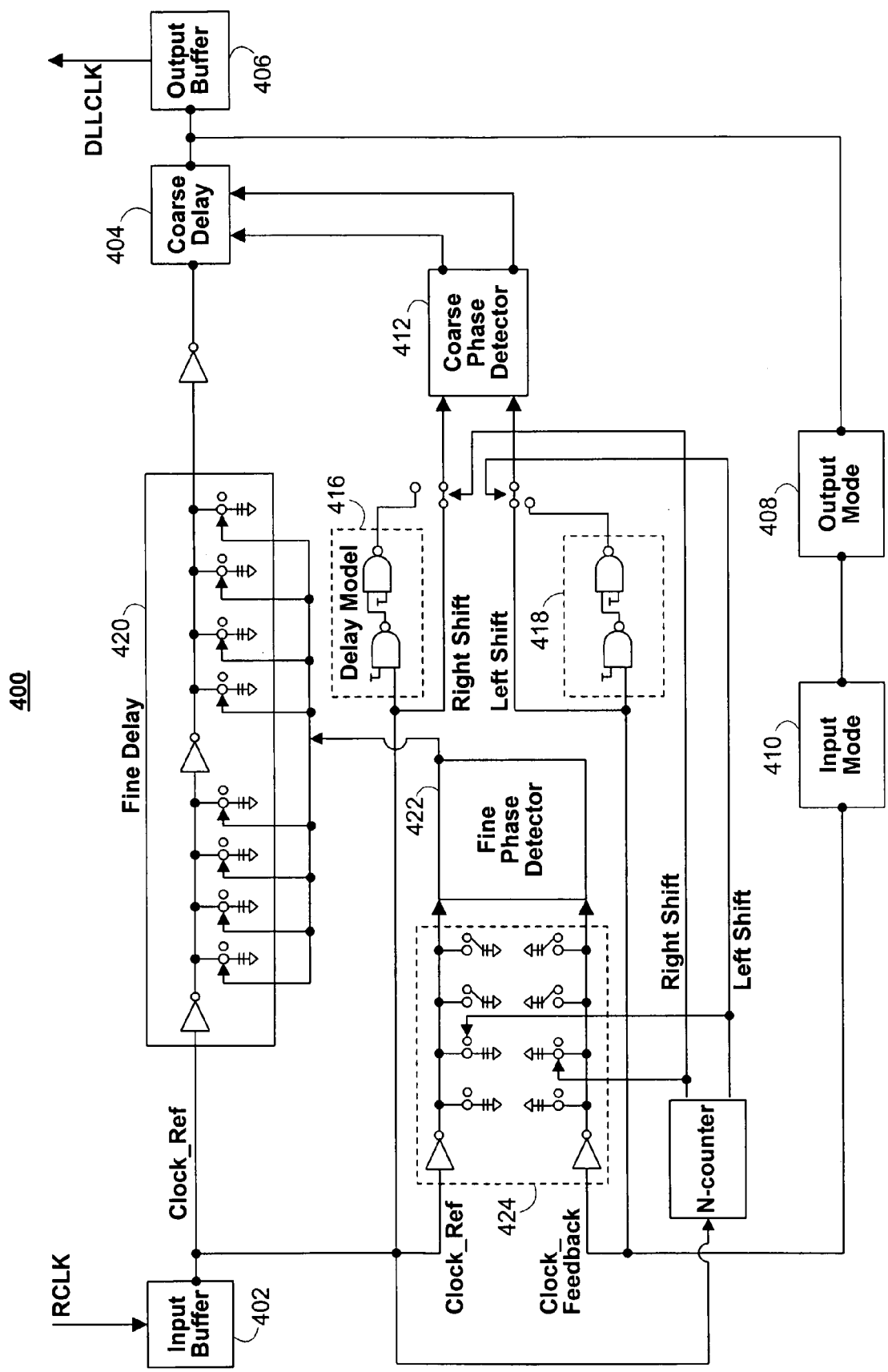
FIG. 4 is a block diagram of a DLL with fine and coarse delay adjustments with feedback compensation according to the invention.

FIG. 4 shows DLL 400 with coarse and fine feedback compensation in accordance with the invention. As with DLL 300, DLL 400 includes input buffer 402, variable delay line 404, output buffer 406, output delay model 408, input delay model 410, coarse phase detector 412, fine delay line 420, and fine phase detector 422 which all operate similarly or identically to their corresponding counterparts in DLL 300. DLL 400 also preferably includes N-counter 414, right-shift delay model 416, left-shift delay model 418, and fine delay model 424.

DLL 400 provides coarse feedback compensation with right-shift delay model 416 and left-shift delay model 418, which operate as described with respect to DLL 200. DLL 400 additionally provides fine delay model 424 to implement fine feedback compensation. Similar to the coarse feedback compensation delay models, fine delay model 424 is adjusted when fine delay line 420 is adjusted. In this embodiment, fine delay model 424 may be applied to both inputs of fine phase detector 422, but can also be designed to add delay to only a single input.

The adjustment to fine delay model 424 is ideally made for the amount of time necessary for the adjustment to fine delay line 420 to propagate through to phase detector 412. The timing of this adjustment is controlled by N-counter 414. The delay of fine delay model 424 is adjusted in the same way as fine delay line 420, by connecting and disconnecting capacitors 403. The combination of these coarse and fine delay models provides delay on the feedback path to replicate the complete range of coarse and fine adjustments made to variable delay line 404 and fine delay line 420.

Figure 5:
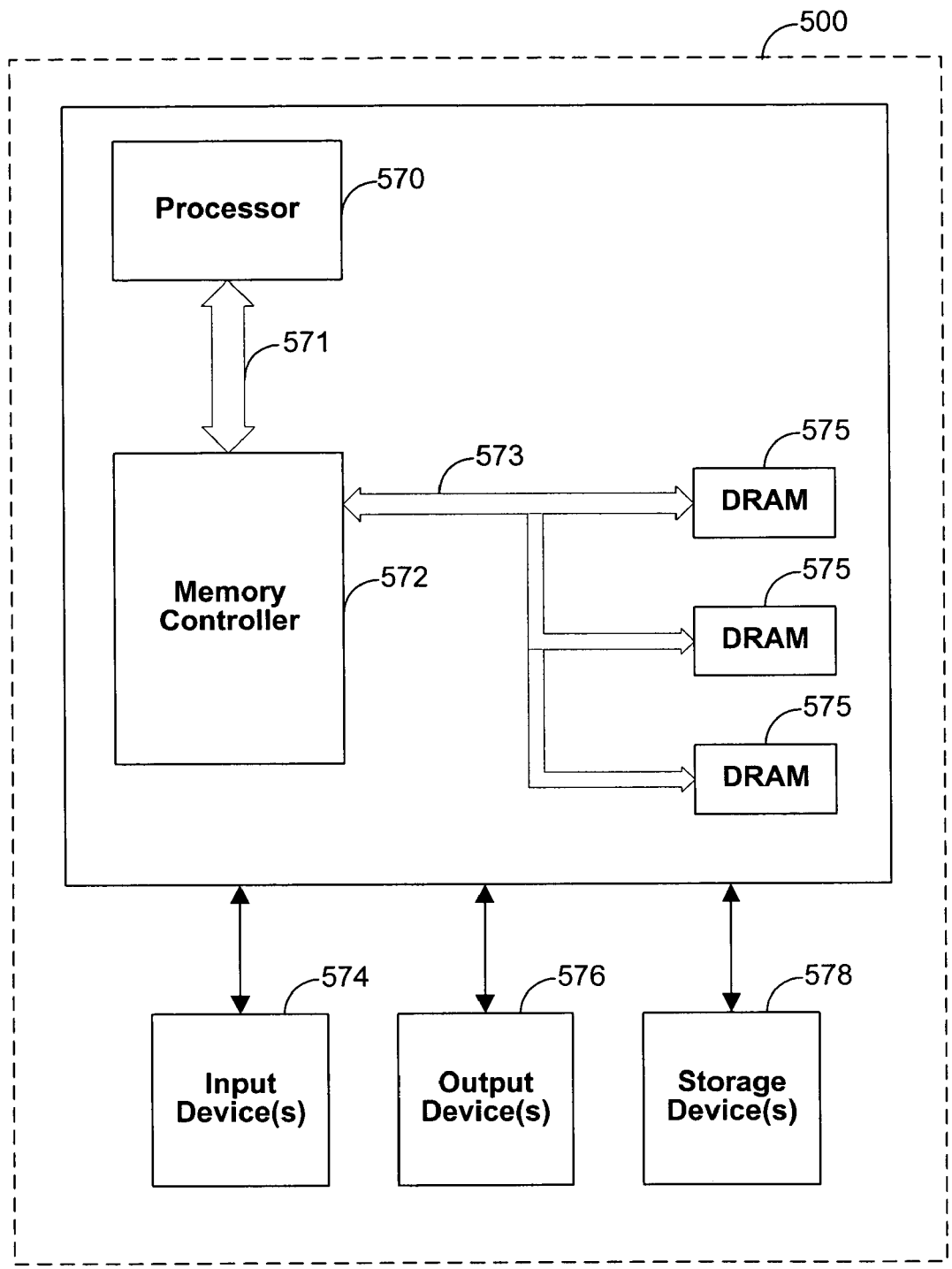
FIG. 5 is a block diagram of a system that incorporates the invention.

FIG. 5 shows a system that incorporates the invention. System 500 includes a plurality of DRAM chips 575, a processor 570, a memory controller 572, input devices 574, output devices 576, and optional storage devices 578. Data and control signals are transferred between processor 570 and memory controller 572 via bus 571. Similarly, data and control signals are transferred between memory controller 572 and DRAM chips 575 via bus 573. One or more DRAM chips 510 include a delay-locked loop (DLL) with in accordance with the invention. A DLL with feedback compensation may also be included in memory controller 572. Moreover, DLLs with feedback compensation in accordance with the invention may be included in any part of the system that uses DLLs. These DLLs allow the system to operate more accurately at higher clock speeds. Input devices 574 can include, for example, a keyboard, a mouse, a touch-pad display screen, or any other appropriate device that allows a user to enter information into system 500. Output devices 576 can include, for example, a video display unit, a printer, or any other appropriate device capable of providing output data to a user. Note that input devices 574 and output devices 576 can alternatively be a single input/output device. Storage devices 578 can include, for example, one or more disk or tape drives.

Note that the invention is not limited to use in DRAM chips, but is applicable to other systems and integrated circuits that use DLLs.

Thus it is seen that DLLs with feedback compensation are provided. One skilled in the art will appreciate that the invention can be practiced by other than the described embodiments, which are presented for purposes of illustration and not of limitation, and the present invention is limited only by the claims which follow.

I claim:

1. A method of adjusting a phase difference between a reference signal and an output signal, said method comprising:
    receiving a reference signal;
    delaying said reference signal to produce an output signal;
    feeding back said output signal;
    measuring a phase difference between said fed back output signal and said reference signal;
    adjusting said delaying of said reference signal in accordance with said measured phase difference to produce an adjusted output signal;
    delaying temporarily said reference signal or said fed back signal until said adjusted output signal is fed back;
    measuring the phase difference between said temporarily delayed reference or fed back signal and the other of said reference and fed back signal until said adjusted output signal is fed back; and
    adjusting said delaying of said reference signal in accordance with said measured phase difference between said temporarily delayed signal and the other of said signals reference and fed back to produce a further adjusted output signal.

2. The method of claim 1 wherein said adjusting said delaying comprises making fine and coarse delay adjustments.

3. The method of claim 1 wherein said delaying temporarily comprises making fine and coarse delay adjustments.

4. The method of claim 1 wherein:
    said delaying delays said reference signal by a first number of clock periods; and
    said delaying temporarily occurs for a second number of clock periods less than said first number of clock periods.

5. A method of adjusting a phase difference between a periodic reference signal and an output signal, said method comprising:
    receiving a periodic reference signal;
    generating an output signal synchronized to said reference signal;
    measuring the phase difference between said reference signal and said output signal;
    adjusting said generating of said output signal to generate an adjusted output signal in accordance with said measuring; and
    temporarily adjusting at least one of said reference signal and said output signal for use in said measuring until the phase difference between said adjusted output signal and said reference signal can be measured.

6. The method of claim 5 wherein said temporarily adjusting comprises delaying only one of said reference and output signals.

7. The method of claim 5 wherein said adjusting comprises adjusting the phase of said output signal.

8. The method of claim 7 wherein said temporarily adjusting comprises adjusting the phase of said output signal by the same amount of phase as said adjusting.

9. A delay-locked loop circuit comprising:
    a variable delay having an input operative to receive a periodic reference signal, an output, and a control input, said control input operative to vary the delay of a signal propagating from said variable delay input to said variable delay output;
    a phase detector having a first input operative to receive said periodic reference signal, a second input, and an output coupled to said variable delay control input, said phase detector operative to detect a phase difference between signals received at its first and second inputs and to vary said delay of said variable delay based on said detected difference;
    a counter having an input coupled to receive said reference signal and an output, said counter operative to output a signal after counting a number of reference signal clock cycles, said counting commencing substantially upon said phase detector causing said delay of said variable delay to be varied; and
    a delay unit having an input coupled to said variable delay output, a control input coupled to said counter output, and an output coupled to said phase detector second input, said delay unit operative to delay a signal received at said delay unit input in accordance with a first signal received at said control input and operative to pass a signal received at said delay input substantially without delay in accordance with a second signal received at said control input.

10. The circuit of claim 9 further comprising a second delay unit having an input operative to receive said reference signal, a control input coupled to said counter output, and an output coupled to said phase detector first input, said delay unit operative to delay a signal received at said delay unit input in accordance with a first signal received at said control input and operative to pass a signal received at said delay input substantially without delay in accordance with a second signal received at said control input.

11. A delay-locked loop circuit comprising:
    a first variable delay line having an input operative to receive a periodic reference signal, an output, and a control input, said control input operative to vary the delay of a signal propagating from said first variable delay input to said first variable delay output line;
    a second variable delay line having an input operative to receive said first variable delay output, an output, and a control input, said control input operative to vary the delay of a signal propagating from said second variable delay input to said second variable delay output line;
    a phase detector having a first input operative to receive said periodic reference signal, a second input, and first and second variable delay line control outputs, said detector operative to detect a phase difference between signals received at its first and second inputs and to vary said delay of at least one of said first and second variable delay lines based on said detected difference;

a counter having an input coupled to receive said periodic reference signal and an output, said counter operative to output a signal after counting a number of clock cycles of said reference signal;

a delay unit having an input coupled to said second variable delay output and an output coupled to said phase detector second input, said delay unit operative to delay a signal propagating between said delay unit input and said delay unit output, wherein said delay is varied in response to said phase detector varying said delay of at least one of said first and second variable delay lines until said number of clock cycles has been counted.

12. The circuit of claim 11 further comprising a second delay unit having an input operative to receive said reference signal and an output coupled to said phase detector first input, said delay unit operative to delay a signal propagating between said delay unit input and said delay unit output, wherein said delay is varied in response to said phase detector varying said delay of one of said first and second variable delay lines until said number of clock cycles has been counted.

13. The circuit of claim 11 wherein said first variable delay is operative to provide coarse delay adjustments.

14. The circuit of claim 11 wherein said second variable delay is operative to provide fine delay adjustments.

15. The circuit of claim 11 wherein said counter is operative to commence counting substantially upon said phase detector causing said delay of said variable delay line to be varied.

16. Apparatus for adjusting the phase difference between a periodic reference signal and an output signal, said apparatus comprising:
    means for receiving a periodic reference signal;
    means for delaying said reference signal to produce an output signal;
    means for feeding back said output signal;
    means for measuring a phase difference between said fed back output signal and said reference signal;
    means for adjusting said means for delaying said reference signal in accordance with said measured phase difference to produce an adjusted output signal; and
    means for delaying temporarily said reference signal or said fed back signal until said adjusted output signal is fed back; wherein:
    said means for measuring measures the phase difference between said temporarily delayed reference or fed back signal and the other of said reference and fed back signal until said adjusted output signal is fed back; and
    said means for adjusting adjusts said delaying of said reference signal in accordance with said measured phase difference between said temporarily delayed signal and the other of said signals reference and fed back to produce a further adjusted output signal.

17. The apparatus of claim 16 wherein said means for adjusting comprises a fine delay adjustment and a coarse delay adjustment.

18. The apparatus of claim 16 wherein said means for delaying temporarily comprises a fine delay adjustment and a coarse delay adjustment.

19. The apparatus of claim 16 wherein:
    said means for delaying delays said reference signal by a first number of clock periods; and
    said means for delaying temporarily does so for a second number of clock periods less than said first number of clock periods.

20. Apparatus for adjusting a phase difference between a reference signal and an output signal, said apparatus comprising:
    means for receiving a reference signal;
    means for generating an output signal synchronized to said reference signal;
    means for measuring the phase difference between said reference signal and said output signal;
    means for adjusting said means for generating an output signal to generate an adjusted output signal in accordance with said measured phase difference; and
    means for temporarily adjusting at least one of said reference signal and said output signal for use in said means for measuring until said means for measuring can measure the phase difference between said adjusted output signal and said reference signal.

21. The apparatus of claim 20 wherein said means for temporarily adjusting comprises means for temporarily adjusting the phase one of said reference and output signals.

22. The apparatus of claim 20 wherein said means for adjusting comprises means for adjusting the phase of said output signal.

23. The apparatus of claim 22 wherein said means for temporarily adjusting comprises means for temporarily adjusting the phase of said output signal by the same amount of phase as said means for adjusting.

24. A computer system comprising:
    a processor;
    a memory controller coupled to said processor; and
    a plurality of dynamic random access memory (DRAM) chips coupled to said memory controller, at least one of said DRAM chips comprising a clock synchronization circuit comprising:
    a variable delay having an input operative to receive a periodic reference signal, an output, and a control input, said control input operative to vary the delay of a signal propagating from said variable delay input to said variable delay output;
    a phase detector having a first input operative to receive said reference signal, a second input, and an output, said detector operative to detect a phase difference between signals received at its first and second inputs and to vary said delay of said variable delay based on said detected difference;
    a counter having an input coupled to receive said reference signal and an output, said counter operative to output a signal after counting a number of clock cycles of said reference signal; and
    a delay unit having an input coupled to said variable delay output, a control input, and an output coupled to said phase detector second input, said delay unit operative to delay a signal received at said delay unit input in accordance with a first signal received at said control input and operative to pass a signal received at said delay input substantially without delay in accordance with a second signal received at said control input.

* * * * *

UNITED STATES PATENT AND TRADEMARK OFFICE
CERTIFICATE OF CORRECTION

PATENT NO. : 7,078,950 B2 Page 1 of 1
APPLICATION NO. : 10/895649
DATED : July 18, 2006
INVENTOR(S) : Gary M. Johnson It is certified that error appears in the above-identified patent and that said Letters Patent is hereby corrected as shown below:

Claim 1, column 7, line 46, change "signals reference and fed back" to --reference and fed back signals--.

Claim 11, column 8, line 60, change "delay output line" to --delay line output--.

Claim 11, column 8, line 65, change "delay output line" to --delay line output--.

Claim 16, column 9, line 58, change "signals reference and fed back" to --reference and fed back signals--.

Signed and Sealed this

Twenty-sixth Day of December, 2006

JON W. DUDAS
*Director of the United States Patent and Trademark Office*